(12) United States Patent
Kataoka et al.

(10) Patent No.: US 6,548,153 B2
(45) Date of Patent: Apr. 15, 2003

(54) COMPOSITE MATERIAL USED IN MAKING PRINTED WIRING BOARDS

(75) Inventors: Takashi Kataoka, Ageo (JP); Yutaka Hirasawa, Okegawa (JP); Takuya Yamamoto, Ageo (JP); Kenichiro Iwakiri, Ageo (JP); Tsutomu Higuchi, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 10/046,478

(22) Filed: Jan. 14, 2002

(65) Prior Publication Data

US 2002/0090497 A1 Jul. 11, 2002

Related U.S. Application Data

(63) Continuation of application No. 09/257,643, filed on Feb. 25, 1999, now abandoned.

(30) Foreign Application Priority Data

Oct. 19, 1998 (JP) .............................................. 10-297399

(51) Int. Cl.⁷ .............................. B32B 3/00; B32B 15/08
(52) U.S. Cl. ........................................ 428/209; 428/458
(58) Field of Search ................................ 428/209, 458; 174/250

(56) References Cited

U.S. PATENT DOCUMENTS

| 4,088,544 A | 5/1978 | Hutkin ........................ 204/12 |
| 4,722,765 A | * 2/1988 | Ambros et al. .............. 156/630 |
| 4,889,573 A | 12/1989 | Stein et al. .................... 156/89 |

FOREIGN PATENT DOCUMENTS

| EP | 0 297 678 | 1/1989 | ............ H05K/3/02 |
| EP | 0 398 721 | 11/1990 | .......... H05K/03/38 |
| GB | 859 848 | 1/1961 | |
| GB | 1 462 001 | 1/1977 | ............ C25D/3/38 |
| GB | 2 012 307 A | 7/1979 | ............ C25D/1/04 |

* cited by examiner

Primary Examiner—Cathy Lam
(74) Attorney, Agent, or Firm—Jenkens & Gilchrist (57) ABSTRACT

A composite material for use in making printed wiring boards comprising a carrier having releasable conductive fine particles on its surface. The composite is laminated to a substrate with the conductive fine particles facing the substrate and the carrier removed, leaving the surface of the conductive fine particles exposed. Printed wiring is formed using the conductive fine particles as its base, thus providing improved peel strength and permitting formation of fine wiring lines and spaces.

11 Claims, 4 Drawing Sheets

COMPOSITE MATERIAL USED IN MAKING PRINTED WIRING BOARDS

This is a continuation of Ser. No. 09/257,643, filed Feb. 25, 1999, now abandoned.

FIELD OF THE INVENTION

The present invention relates to a novel composite material and uses therefor. More particularly, the invention relates to a composite material which may be used for producing a printed wiring board having fine wiring patterns.

BACKGROUND OF THE INVENTION

With the recent miniaturization and densification of electronic equipment, the pattern widths and spacing of printed writing boards used for electronic equipment have become smaller year by year. As a result, the copper foil used for forming wiring has tended to become thinner, for example, from 35 $\mu$m or 18 $\mu$m to 12 $\mu$m.

Figure 1:
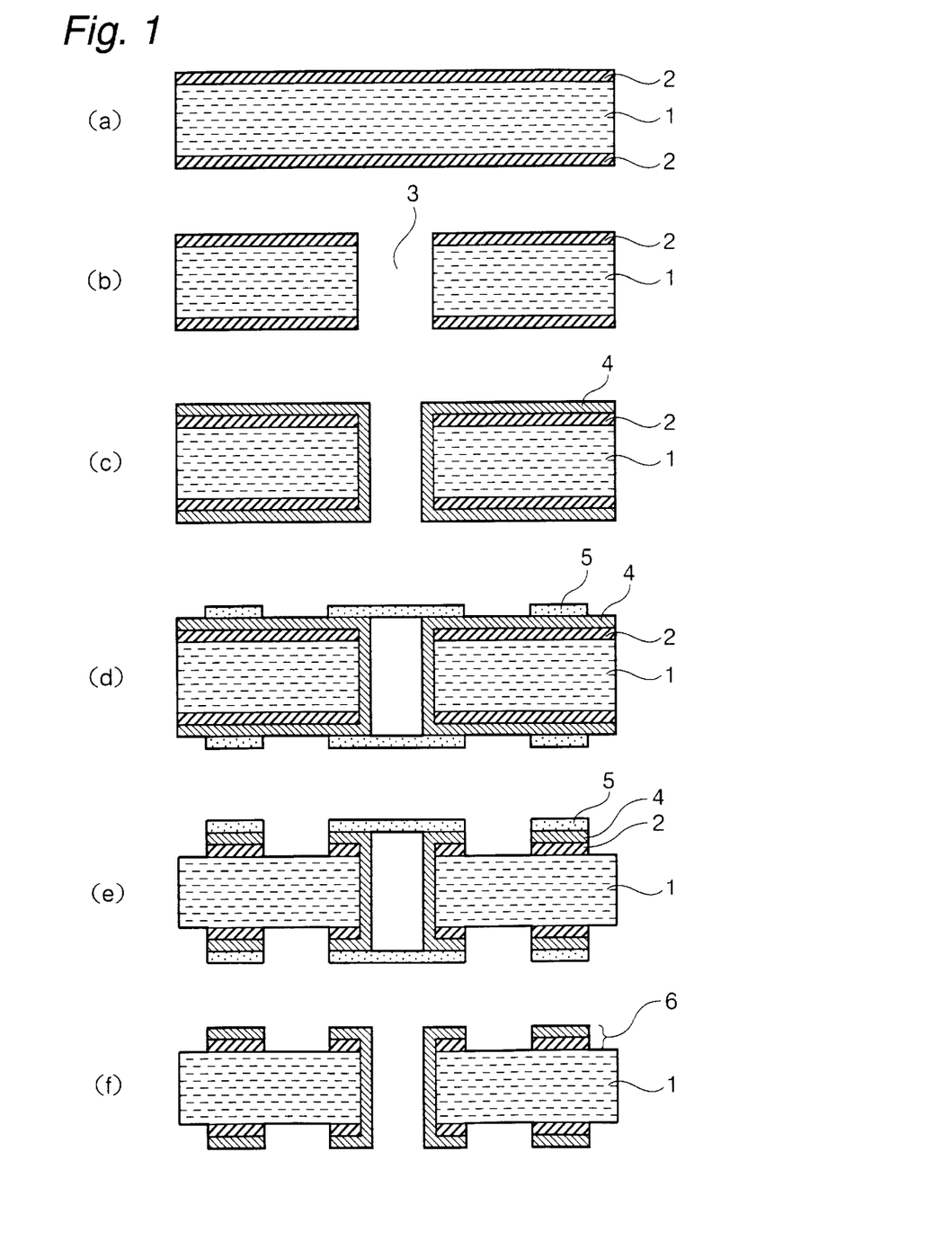
FIGS. 1(a)–(f) illustrate a panel plating process for preparing a printed wiring board.

When using such metal foils, a printed wiring board may be produced by the steps shown in FIGS. 1(a)–(f) (a panel plating process). A metal foil 2 is bonded to a substrate 1 made of an insulating resin to form a laminate as shown in FIG. 1(a). In order to electrically connect the lower wiring to the upper wiring, a hole is opened by drilling or with a laser beam to form a via hole 3 as shown in FIG. 1(b). Then, electroless plating and electroplating are used to provide a copper layer 4 on the metal foils 2 and the via hole 3 as shown in FIG. 1(c). The surface of layer 4 is coated with a resist 5 which is irradiated through a photo mask and developed, thus defining the wiring pattern as shown in FIG. 1(d). Thereafter, the plated layer 4 and the metal foil 2 are removed by etching to leave the desired wiring pattern 6 as shown in FIG. 1(e), after which the resist is removed as shown in FIG. 1(f).

In the production of printed wiring board by the panel plating process, a wiring having a finer pitch can be formed by reducing the thickness of the metal foil. Thus, the need for thinner metal foils has increased. It is difficult to handle an extremely thin metal foil, and tears or wrinkles sometimes occur when the metal foil is bonded to the insulating substrate to form a laminate. Further, in the panel plating process, when the laminate is directly irradiated with a laser beam to form a via hole, a burr may be formed at the edge of the metal foil near the via hole. Because plating on such burrs proceeds more rapidly than plating on metal foil, the burrs become larger, causing problems with adherence of the plating on the metal foil and of the resist. For this reason, the metal foil at the hole opening must be removed by mechanical abrasion or the like, adding complexity to the process of making via holes.

Figure 2:
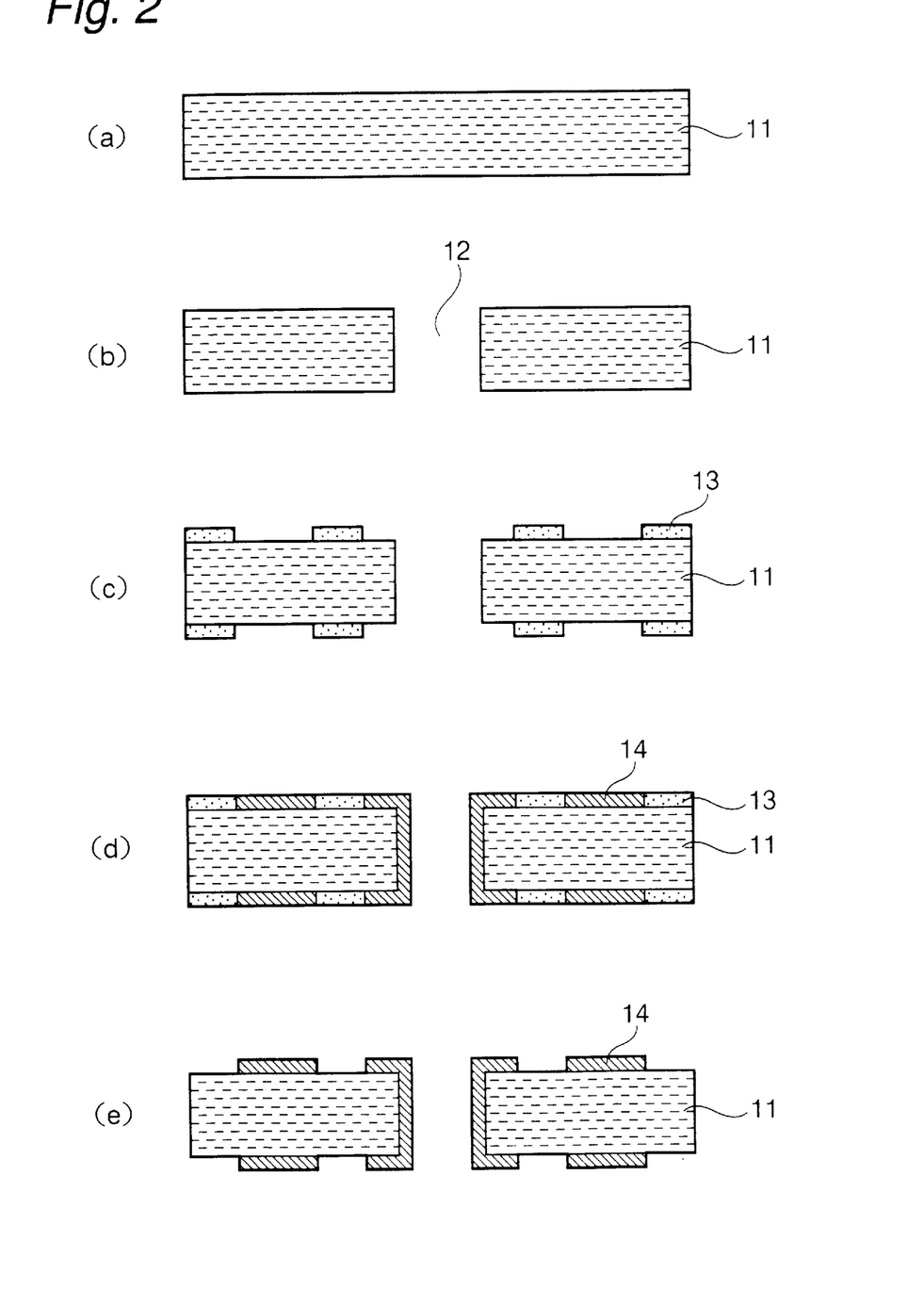
FIGS. 2(a)–(e) illustrate a pattern plating process for preparing a printed wiring board.

There is also a process for directly producing a printed wiring board without using any metal foil. In this process, a printed wiring board is prepared through the steps shown in FIGS. 2(a)–(e) (a pattern plating process). A substrate 11 made of an insulating resin has a hole opened by drilling or with a laser beam to form a via hole 12 as shown in FIGS. 2(a) and 2(b). Then, the substrate is coated with a resist 13 and irradiated through a photo mask and developed to create the wiring pattern as shown in FIG. 2(c). Electroless plating and electroplating are using to form a plated layer as shown in FIG. 2(d), after which the resist 13 is removed, leaving the desired wiring pattern 14, as shown in FIG. 2(e).

The pattern plating process wherein metal foil is not used is advantageous in that it is feasible to make a thin surface plated layer and the steps of the process are simple. It is necessary, however, to roughen the surface of the insulating resin substrate by chemical or physical means to enhance bond strength between the resin and the conductive material. Even if the surface is roughened, however, insufficient bond strength between the wiring pattern which is formed and the insulating resin is a problem. Also, the printed wiring board obtained by the pattern plating process does not always have satisfactory heat resistance. Therefore, when the printed wiring board is heated, such as when soldering is used to mount electronic parts, the bond strength between the wiring pattern and the substrate is weakened, and the wiring pattern may separate. Moreover, since the metallic layer formed is brittle, breakage of the wires is occasionally observed because of applied flexure stress.

The present inventors have found that use of a composite material comprising a carrier having a releasable conductive fine particles on its surface makes it possible to produce a printed wiring board free from all of the above problems and permits formation of wiring patterns having very fine pitch.

OBJECT OF THE INVENTION

The present invention is intended to solve the problems discussed above, and to provide a composite material capable of producing printed wiring boards having an excellent bond between the wiring pattern and the substrate and excellent heat resistance, with very fine wiring lines and pitch.

SUMMARY OF THE INVENTION

The composite material according to the invention comprises a carrier having releasable conductive fine particles on its surface.

The conductive fine particles have dimensions of 0.1–5.0 $\mu$m relative to the thickness of the composite material.

In the composite material, the surface roughness (Rz) of the carrier on which the conductive fine particles is formed preferably is in the range of 1.0–10.0 $\mu$m.

The invention also includes both a laminate made by laminating the composite material described above onto a surface of a substrate, and the resulting laminate from which the carrier has been removed.

The printed wiring board according to the invention is made by using the composite material described above.

DESCRIPTION OF ILLUSTRATIVE EMBODIMENTS

The present invention is described in detail with reference to the drawings.

Composite Material for Making Wiring Circuitry

Figure 3:
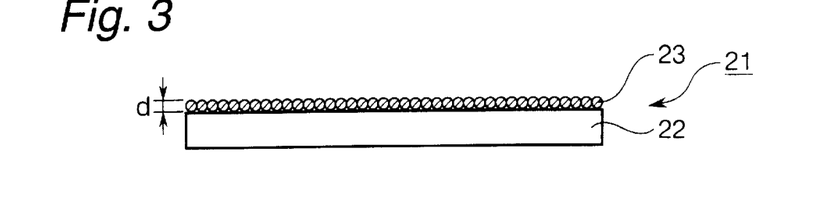
FIG. 3 is a sectional view of an embodiment of the composite material according to the invention.

FIG. 3 is a sectional view showing a preferred embodiment of the composite material of the invention. In this embodiment, the composite material 21 comprises a carrier 22 and releasable conductive fine particles 23 on the carrier surface.

Examples of carriers 22 include:

(a) metal foils, such as copper foil, copper alloy foil, aluminum foil, and stainless steel foil, and composite metal foils, e.g., copper or zinc plated on aluminum foil;

(b) sheets of synthetic resins such as polyimide, polyester, polyurethane and Teflon; and (c) sheets of inorganic materials.

The carrier 22 typically has a thickness of 5–200 μm, preferably 18–70 μm.

The type of the releasable conductive particles 23 is not limited, except that they are electrically conductive. Examples of the conductive particles include fine particles of metals, such as copper, silver, gold, platinum, zinc and nickel, fine particles of alloys of these metals, fine particles of inorganic compounds, such as indium oxide and tin oxide, and fine particles of conductive organic compounds, such as polyaniline.

The conductive fine particles 23 may consist of conductive fine particles of a single kind or of mixed fine particles of two or more kinds of conductive material.

The dimension (d) of the conductive fine particles desirably is in the range of 0.1–5.0 μm, preferably 0.2–2.0 μm, and more preferably 0.5–1.0 μm, relative to the thickness of the composite 21.

In the conductive fine particles, the shape of the individual particles or aggregates of the particles is not limited, and some conductive fine particles may gather to form, for example, a cluster, block, whisker or branch.

It is desirable that at least a part of the conductive fine particles 23 are not connected to each other. The conductive fine particles may be dispersed, or aggregates of the conductive fine particles may be dispersed in such a manner that the aggregates are not connected to each other. Likewise, the conductive fine particles and the aggregates of the conductive fine particles may be dispersed in such a manner that the conductive fine particles and aggregates are not connected to each other. Unlike films or foils, the conductive fine particles 23, per se, cannot be removed singly or cannot be handled singly.

The conductive fine particles 23 are releasable from the surface of the carrier 22. Therefore, in the production of a laminate, after bonding the composite material of the invention to an insulating substrate, the carrier can easily be removed and the conductive fine particles remain on the insulating substrate.

The surface roughness (Rz) of the carrier on which the conductive fine particle is formed preferably is in the range of 0.5–10.0 μm, more preferably 1.0–5.0 μm, and most preferably 2.0–4.5 μm. The surface roughness of the present invention is determined in accordance with the method of JIS-C-6515 or IPC-TM-650.

Various processes may be used to prepare the composite material of the invention. For example, the composite material can be prepared by forming and bonding the conductive fine particles on the carrier by electroplating, electroless plating or the like, or the composite can be prepared by coating the carrier with an organometallic compound such as alkoxide, followed by hydrolysis. The composite material also may be prepared by coating the carrier with a dispersion of the conductive fine particles or spraying the conductive fine particles on the carrier to bond them to the carrier.

In forming particulate copper by electrodeposition on the carrier, the composite material may be prepared by the following process. The carrier is placed in a plating bath to electrodeposit fine particles of copper on the carrier. The current density is determined by the composition of plating bath, for example, 1–50 A/dm$^2$. Examples of the plating baths which may be employed include a copper pyrophosphate plating bath, a copper cyanide plating bath, and an acid copper sulfate plating bath. Of these, the acid copper sulfate plating bath is preferred.

To the acid copper sulfate bath, additives, such as α-naphthoquinoline, dextrin, glue, PVA, triethanolamine and thiourea, may optionally be added in amounts of 0.5–20 ppm. When the additives are added to the plating bath, the shape of the particulate copper electrodeposited can be controlled.

Examples of combinations of the conductive fine particles and the carrier in the composite material of the invention are given in Table 1.

TABLE 1

| Conductive Fine Particles | Carrier |
| --- | --- |
| copper fine particles | copper foil |
| copper fine particles | copper alloy foil |
| copper fine particles | aluminum foil |
| copper fine particles | copper plated aluminum foil |
| copper alloy fine particles | copper foil |
| copper alloy fine particles | copper alloy foil |
| copper alloy fine particles | copper plated aluminum foil |

It is desirable that the composite material of the invention has been subjected to a treatment which makes it possible to separate the carrier when forming a wiring pattern.

Examples of such treatments include forming a release layer between the conductive fine particles and the carrier, and removing the carrier by dissolution without doing damage to the conductive fine particles.

A release layer permits bonding between the conductive fine particles and the carrier with a bond strength such that the conductive fine particles is readily released. When the carrier is, for example, a metal foil, other metals than the metal of the carrier or inorganic compounds, such as oxides and sulfides of the same metals as the metal of the carrier, may be used for the release layer. If the carrier is a copper foil, chromium alloy, copper sulfide or the like may be employed. If the carrier is an aluminum foil, zinc or the like may be used. An organic release layer of a nitrogen- or sulfur-containing compounds or carboxylic acids may also be used. An example of a suitable nitrogen-containing compound is a substituted triazole, e.g., carboxybenzotriazole, benzotriazole or imidazole. Thiocyanuric acid is an example of a suitable sulfur-containing compound. Oleic acid exemplifies suitable carboxylic acids.

It is desirable that the composite material of the invention is treated to prevent the conductive fine particles from being embedded in a resin substrate during bonding of the composite material to the resin substrate. An example of such a treatment is plating a covering layer over the conductive fine particles on the surface of the carrier.

It is also desirable that the conductive fine particles are subjected to a passivation treatment.

Laminates and Printed Wiring Boards

A laminate according to the invention is formed by the use of the composite material of the invention. The laminate is obtained by bonding the composite material to an insulating resin substrate with the fine particles facing the substrate. There is no limitation on the insulating resin substrate to be used. Examples include composite substrates, such as glass-epoxy, glass-polyimide, glass-polyester, Aramid-epoxy, FR-4, paper-phenolic and paper-epoxy. The bonding between the composite material and the insulating resin substrate is typically carried out at a temperature of about 155°–230° C. under a pressure of about 15–150 kgf/cm$^2$.

In the present invention, the laminate which is obtained by laminating the composite material onto a surface of a substrate may be referred to as "the laminate having a carrier," and the resulting laminate from which the carrier has been removed may be referred to as "the laminate without a carrier." The fine particles remain on the surface of the substrate.

Examples of the methods to remove the carrier include peeling and removing the carrier by abrasion or dissolution.

For peeling the carrier, the composite material desirably has a peel strength, as measured in accordance with the method of JIS-C-6481, ranging from 1–300 gf/cm, preferably 5–100 gf/cm. If the composite material has a peel strength in this range, the carrier can easily be peeled from the composite material after the laminate has been formed. When the carrier is to be peeled off, it is desirable that a release layer has been formed between the carrier and the conductive fine particles, as previously described.

The removal of the carrier using abrasion, dissolution or the like may be carried out as follows. If the carrier is a metal foil, such as a copper foil or an aluminum foil, the carrier can be removed by etching or by dissolving the metal foil in an acid solution or an alkali solution. If the carrier is a synthetic resin sheet, the carrier can be removed by dissolving the synthetic resin in an organic solvent.

A printed wiring board according to the invention can be obtained by forming printed wiring on the laminate without a carrier. The process for forming the printed wiring is not specifically limited and, for example, both the aforesaid panel plating process and pattern plating process can be adopted.

In the panel plating process, the printed wiring board is produced through the steps shown in, for example, FIGS. 4(a)–(f). In detail, a laminate 21 is obtained by bonding the composite material to the insulating resin substrate 31 and then removing the carrier from the composite material 31 to remain the conductive fine particles 23 on the substrate 31 as shown in FIG. 4(a). Then, the laminate 21 is irradiated with a laser beam to form a via hole 32 is shown in FIG. 4(b), after which electroless plating, followed by electroplating, are applied on the via hole surface and the insulating resin layer surface to form a plated layer 33 as shown in FIG. 4(c). The surface of the plated layer 33 is coated with a resist 34 and irradiated through a photomask to define a wiring pattern as shown in FIG. 4(d). Then the plated layer 33 and the conductive fine particles 23 on areas other than the wiring pattern are removed by etching as shown in FIG. 4(e). Finally, the resist is removed to form a wiring pattern as shown in FIG. 4(f).

Because the printed wiring board of the invention uses the composite material of the invention, a thin wiring having fine pitch can be formed. Further, because the composite includes the conductive fine particles, rather than a metal foil, no burrs are made at the edge of the via hole during the opening of the via using a laser. Hence, there is no burr to become larger when layer 33 is applied. Consequently, there is no need to clear the hole opening by etching or the like before applying layer 33. Moreover, the via hole opening can be made with a laser of lower output than that hitherto proposed.

In another process, which may be referred to as a pattern plating process, the wiring pattern is plated using the steps shown in, for example, FIGS. 5(a)–(f). A laminate having the conductive fine particles 23 on the substrate 41 shown in FIG. 5(a) obtained in the same manner as above in FIG. 4(a) is directly irradiated with a laser beam to open via hole 42 as shown in FIG. 5(b). Subsequently, electroless plating is applied to the whole surface, including the via hole surface to form an electroless plated layer 43 as shown in FIG. 5(c). Then, a resist 44 is applied and irradiated to define the wiring pattern as shown in FIG. 5(d). Electroplating is used to form a wiring 45 having the desired thickness as shown in FIG. 5(e). Thereafter, the resist 44 on the surface is removed, and the electroless plated layer 43 and the conductive fine particles 23 on the areas other than the wiring pattern are removed by etching (sometimes referred to as "flash etching") to produce a printed wiring as shown in FIG. 5(f). In this process, before removal of resist, the wiring surface may be subjected to tin-lead plating to form an etching resist.

Figure 4:
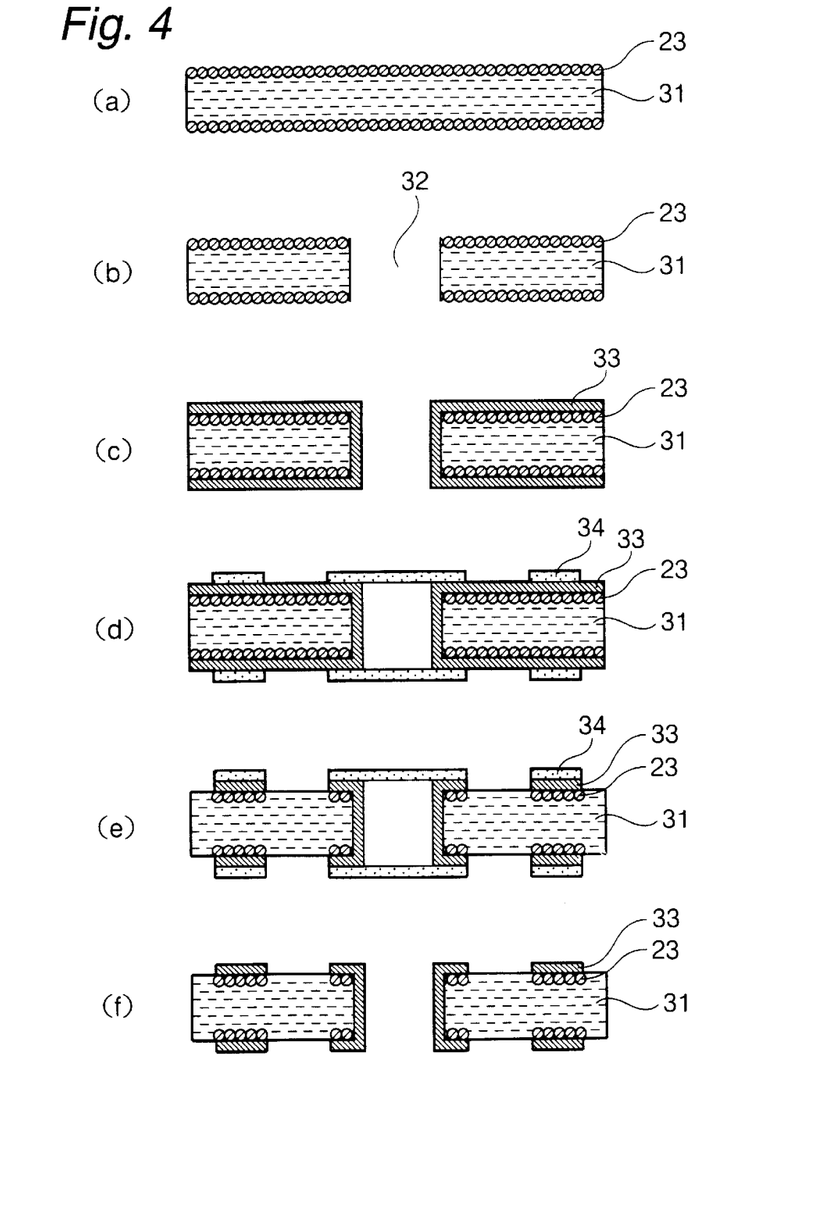
FIGS. 4(a)–(f) illustrate a panel plating process for preparing a printed wiring board of the invention.
Figure 5:
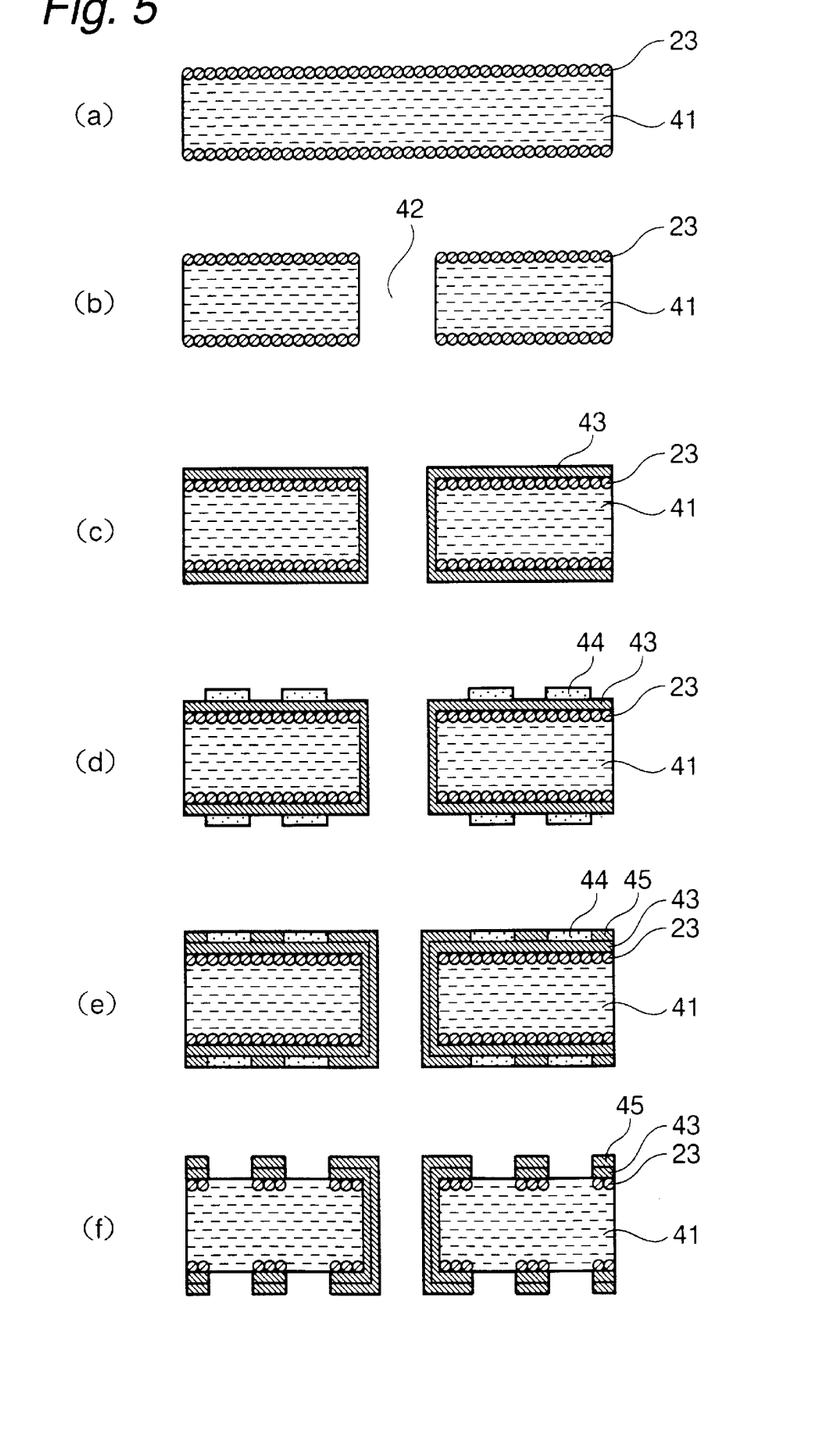
FIGS. 5(a)–(f) illustrate a pattern plating process for preparing a printed wiring board of the invention.

Whether a printed wiring board is made using the process of FIGS. 4 and 5, excellent bond strength between the wiring pattern and the insulating resin and excellent heat resistance can be obtained.

By use of the printed wiring board of the invention, a multi-layer printed wiring board can be manufactured. That is, the printed wiring board of the invention is used as a substrate containing inner layer wiring, and the printed wiring board is bonded to the composite material of the invention through an insulating resin layer. Then, the carrier is removed from the composite material, and a via hole and a wiring are formed, followed by plating, as described above to obtain a multi-layer wiring board. If such operations are repeated, the number of layers of the multi-layer printed wiring board can be further increased.

Effect of the Invention

By use of the composite material of the invention, the problem of burrs being made during the opening of the via holes by drilling, laser beam irradiation or other methods can be solved, and the opening of via holes can be carried out even by lasers of low output. Moreover, use of the composite material of the invention makes it possible to produce printed wiring boards having wiring patterns with fine pitch, i.e., both the wiring lines and the spaces between them are narrow, because the thickness of the conductive material is reduced.

Eliminating the use of copper foil permits formation of finer wiring, since plated copper is more accurately etched than copper foil. Use of the layer of fine conductive particles provides the needed peel strength, which is not available when plating directly on a substrate.

EXAMPLES

The present invention is further described with reference to the following Examples, but it should be understood that the invention is not intended to be limited to these Examples.

Example 1

Preparation of Composite Material

An electrolytic copper foil having a thickness of 35 μm was prepared as a metal foil carrier. The shiny side surface of the electrolytic copper foil was cleaned for 30 seconds in a cleaning liquid containing sulfuric acid in a concentration of 100 g/L. After the sulfuric acid cleaning, the copper foil was rinsed with purified water.

Then, the copper foil was immersed in an aqueous solution of ammonium sulfide having a concentration 10 g/L at 30° C. for 10 seconds to form a release layer of copper sulfide on the shiny side surface of the copper foil. The release layer of copper sulfide was rinsed with purified water for 10 seconds, and the copper foil with the release layer was electroplated for 5 seconds at a current density of 20 A/dm$^2$ using a plating bath containing 20 g/L of copper and 70 g/L of sulfuric acid at a bath temperature of 40° C., to deposit conductive fine particles of copper on the surface of the release layer.

The resulting composite foil having the conductive fine particles thereon was electroplated for 10 seconds at a current density of 30 A/dm$^2$ using a plating bath containing copper of 75 g/L and sulfuric acid of 80 g/L at a bath temperature of 50° C., to form a covering layer of copper on the conductive fine particles.

Then, the composite material obtained was rinsed, then given a passivation treatment and dried.

The dimension of the conductive fine particles thus obtained was 1.5 μm in the direction of the composite material (dimension d in FIG. 3).

The surface roughness (Rz) of the composite material surface on which the conductive fine particles were formed was 2.9 μm.

Preparation of Laminate

The composite material obtained above was laminated onto four sheets of 0.1 mm thick FR-4 prepreg with the conductive fine particles facing the prepreg. They were heated at 175° C. for 60 minutes under a pressure of 25 kg/cm$^2$ to bond them as a laminate.

After the copper carrier was removed from the laminate by stripping, the whole surface of the laminate was subjected to electroless plating and then to electroplating to form a copper layer having a total thickness of 35 μm on the laminate surface. Thereafter, resist patterns were formed on the copper layer and then etching was used to form a sample with wiring having a width of 10 mm.

Bond Properties

The bond between the wiring and the substrate (FR-4) of sample was evaluated by measuring peel strength according to the method of JIS-C-6481. The peel strength was 1.43 kg/cm and, thus, the wiring had satisfactory bond strength to the substrate.

Heat Resistance

The sample was floated on a solder bath at 160° C. for 20 seconds. Then, the peel strength between the substrate and the wiring was measured to be 1.43 kg/cm. This peel strength was almost the same as that before the solder float test. Thus, the sample was found to have excellent heat resistance.

Preparation of Printed Wiring Board

The composite material obtained above was laminated onto four sheets of 0.1 mm thick FR-4 prepreg with the conductive fine particles facing the prepreg. They were heated at 175° C. for 60 minutes under a pressure of 25 kg/cm$^2$ to bond them as a laminate.

After removal of the carrier from the laminate by stripping, a via hole was opened by irradiating with a carbon dioxide laser. No burrs were formed. Then the laminate was subjected to electroless plating, followed by electroplating, to form a copper layer having a total thickness of 18 μm on the laminate surface. Thereafter, a wiring pattern was etched having a ratio of line width and line space (width/space) of 30 μm/30 μm. Thus, the printed wiring board was found to be suitable for making a wiring having fine pitch.

Example 2

An electrolytic copper foil having a thickness of 35 μm was prepared as a metal foil carrier. The shiny side surface of the electrolytic copper foil was cleaned for 30 seconds in a cleaning liquid containing sulfuric acid in a concentration of 100 g/L. After the sulfuric acid cleaning, the copper foil was rinsed with purified water.

Then, the shiny side surface of the copper foil was immersed in an aqueous solution containing triazinethiol in a concentration of 5 g/L at a liquid temperature of 40° C. for 30 seconds to form an organic release layer on the copper foil carrier surface. Then, the surface of the organic release layer was rinsed. The copper foil with the organic release layer was electroplated at a current density of 15 A/dm$^2$ using a plating bath containing 10 g/L of copper and 170 g/L of sulfuric acid with a bath temperature of 30° C. to deposit conductive fine particles.

The resulting composite foil having the conductive fine particles thereon was electroplated at a current density of 30 A/dm$^2$ using a plating bath containing 75 g/L of copper and 80 g/L of sulfuric acid at a bath temperature of 50° C. to form a covering layer of copper on the conductive fine particles.

The composite material obtained was rinsed and then subjected to a passivation treatment and dried.

The dimension of the conductive fine particles thus obtained was 1.0 μm in the direction of the composite material (dimension d in FIG. 3).

The surface roughness (Rz) of the composite material surface on which the conductive fine particle group was formed was 2.2 μm.

Preparation of Laminate

The composite material obtained above was laminated onto four sheets of 0.1 mm thick FR-4 prepreg with the conductive fine particles facing the prepreg. They were heated at 175° C. for 60 minutes under a pressure of 25 kg/cm$^2$ to bond them as a laminate.

After the copper carrier was removed from the laminate by stripping, the whole surface of the laminate was subjected to electroless plating and then to electroplating to form a copper layer having a total thickness of 35 μm on the laminate surface. Thereafter, resist patterns were formed on the copper layer and then a wiring having a width of 10 mm was formed by a conventional etching process.

Bond Properties

The bond between the wiring and the substrate (FR-4) of sample was evaluated by measuring a peel strength in accordance with the method of JIS-C-6481. The peel strength was 1.35 kg/cm and, thus, the wiring had satisfactory bond strength to the substrate.

Heat Resistance

The sample was floated on a solder bath at 160° C. for 20 seconds. Then, the peel strength between the substrate and the wiring was measured to be 1.35 kg/cm. This peel strength was almost the same as that before the solder float test. Thus, the sample was found to have excellent heat resistance.

Preparation of Printed Wiring Board

The composite material obtained above was laminated onto four sheets of 0.1 mm thick FR-4 prepreg with the conductive fine particles facing the prepreg. They were heated at 175° C. for 6 minutes under a pressure of 25 kg/cm$^2$ to bond them as a laminate.

After removal of the carrier from the laminate by stripping, a via hole was opened by irradiation with a carbon dioxide laser. No burrs were formed. The laminate was then subjected to electroless plating and then to electroplating to form a copper layer having a total thickness of 18 μm on the laminate surface. Thereafter, a wiring pattern was formed by etching having a ratio of line width and line space (width/space) of 30 μm/30 μm. Thus, the printed wiring board was found to be suitable for making a wiring having a fine pitch.

Example 3

Preparation of Composite Material

An aluminum alloy foil (Al—Mn alloy foil) having a thickness of 40 μm is prepared as a metal foil carrier. The aluminum alloy foil is immersed in a plating bath at pH 8.5 containing 30 g/L of sodium hydroxide, 40 g/L of sodium carbonate and 35 g/L of Rochelle salt at a bath temperature of 30° C. for 30 seconds to perform electroless plating of zinc. After forming the plated layer of zinc, the aluminum alloy foil is rinsed with purified water for 30 seconds.

Then, the aluminum alloy copper foil with the zinc plated layer is electroplated for 5 seconds at a current density of 7 A/dm$^2$ using a plating bath at pH 9 containing 20 g/L of copper and 70 g/L of potassium diphosphate at a bath temperature of 25° C., to deposit conductive fine particles of copper on the surface of the zinc plated layer.

The dimension of the conductive fine particles is 0.1 μm in the direction of the composite material.

Then, the composite material obtained is rinsed, then given a passivation treatment and dried.

The surface roughness (Rz) of the composite material surface on which the conductive fine particles are formed is 2.2 μm.

Preparation of Laminate

The composite material obtained above is laminated onto four sheets of 0.1 mm thick FR-4 prepreg with the conductive fine particles facing the prepreg. They are heated at 175° C. for 60 minutes under a pressure of 25 kg/cm$^2$ to bond them as a laminate.

The laminate is immersed in a alkali solution containing 50 g/L of sodium hydroxide and 1 g/L of sodium gluconate, and then the aluminum carrier is dissolved in the alkali solution to remove it from the laminate.

After the aluminum alloy carrier is removed from the laminate, the whole surface of the laminate is subjected to electroless plating and then to electroplating to form a copper layer having a total thickness of 35 μm on the laminate surface. Thereafter, resist patterns are formed on the copper layer and then etching is used to form sample with a wiring having a width of 10 mm.

Bond Properties

The bond between the wiring and the substrate (FR-4) of sample is evaluated by measuring peel strength according to the method of JIS-C-6481. The peel strength is 1.35 kg/cm and, thus, the wiring had satisfactory bond strength to the substrate.

Heat Resistance

The sample is floated on a solder bath at 160° C. for 20 seconds. Then, the peel strength between the substrate and the wiring is measured to be 1.65 kg/cm. This peel strength is almost the same as that before the solder float test. Thus, the sample is found to have excellent heat resistance.

Preparation of Printed Wiring Board

The composite material obtained above is laminated onto four sheets of 0.1 mm thick FR-4 prepreg with the conductive fine particles facing the prepreg. They are heated at 175° C. for 60 minutes under a pressure of 25 kg/cm$^2$ to bond them as a laminate.

After removal of the carrier from the laminate by dissolving aluminum alloy foil in an alkali solution, a via hole is opened by irradiating with a carbon dioxide laser. No burrs are formed. Then the laminate is subjected to electroless plating, followed by electroplating, to form a copper layer having a total thickness of 18 μm on the laminate surface. Thereafter, a wiring pattern is etched having a ratio of line width and line space (width/space) of 30 μm/30 μm. Thus, the printed wiring board is found to be suitable for making a wiring having fine pitch.

Example 4

An electrolytic copper foil having a thickness of 35 μm is prepared as a metal foil carrier. The shiny side surface of the electrolytic copper foil is cleaned for 30 seconds in a cleaning liquid containing sulfuric acid in a concentration of 100 g/L.

After the sulfuric acid cleaning, the copper foil is rinsed with purified water.

Then, the shiny side surface of the copper foil is immersed in an aqueous solution containing triazinethiol in a concentration of 5 g/L at a liquid temperature of 40° C. for 30 seconds to form an organic release layer on the copper foil carrier surface.

The copper foil with the organic release layer is electroplated at a current density of 30 A/dm$^2$ for 2 second using a plating bath containing 15 g/L of copper, 2 g/L of cobalt and 5 g/L of nickel with a bath temperature of 50° C. to deposit conductive fine particles of copper-cobalt-nickel alloy.

The resulting composite foil having the conductive fine particles thereon is electroplated at a current density of 3 A/dm$^2$ using a plating bath containing 8 g/L of cobalt and 18 g/L of nickel at a bath temperature of 50° C. to form a covering layer of cobalt-nickel alloy on the conductive fine particles.

The composite material obtained is rinsed and then subjected to a passivation treatment and dried.

The dimension of the conductive fine particles thus obtained is 3.5 μm in the direction of the composite material (dimension d in FIG. 3).

The surface roughness (Rz) of the composite material surface on which the conductive fine particle group is formed is 3.2 μm.

Preparation of Laminate

The composite material obtained above is laminated onto four sheets of 0.1 mm thick FR-4 prepreg with the conductive fine particles facing the prepreg. They are heated at 175° C. for 60 minutes under a pressure of 25 kg/cm$^2$ to bond them as a laminate.

After the copper carrier is removed from the laminate by stripping, the whole surface of the laminate is subjected to electroless plating and then to electroplating to form a copper layer having a total thickness of 35 μm on the laminate surface. Thereafter, resist patterns are formed on the copper layer and then wiring having a width of 10 mm is formed by a conventional etching process.

Bond Properties

The bond between the wiring and the substrate (FR-4) of sample is evaluated by measuring a peel strength in accordance with the method of JIS-C-6481. The peel strength is 1.50 kg/cm and, thus, the wiring had satisfactory bond strength to the substrate.

Heat Resistance

The sample is floated on a solder bath at 160° C. for 20 seconds. Then, the peel strength between the substrate and the wiring is measured to be 1.50 kg/cm. This peel strength is almost the same as that before the solder float test. Thus, the sample is found to have excellent heat resistance.

Preparation of Printed Wiring Board

The composite material obtained above is laminated onto four sheets of 0.1 mm thick FR-4 prepreg with the conductive fine particles facing the prepreg. They are heated at 175° C. for 60 minutes under a pressure of 25 kg/cm$^2$ to bond them as a laminate.

After removal of the carrier from the laminate by stripping, a via hole is opened by irradiation with a carbon dioxide laser. No burrs are formed. The laminate is then subjected to electroless plating and then to electroplating to form a copper layer having a total thickness of 18 μm on the laminate surface. Thereafter, a wiring pattern is formed by etching having a ratio of line width and line space (width/space) of 30 μm/30 μm. Thus, the printed wiring board is found to be suitable for making a wiring having a fine pitch.

What is claimed is:

1. A composite material for placing conductive fine particles on an insulating substrate, said conductive fine particles to be disposed between a carrier and said substrate, comprising a removable conductive carrier and conductive particles releasably deposited on said carrier, wherein an organic compound is used as a release layer between said carrier and said conductive fine particles.

2. A composite material of claim 1 wherein said conductive carrier is a metal foil.

3. A composite material of claim 1 wherein said conductive fine particles are metal.

4. A composite material of claim 1 wherein said conductive fine particles consist of at least one metal selected from the group consisting of copper, silver, gold, platinum, zinc, nickel, and alloys thereof.

5. A composite material of claim 1 wherein said organic compound is at least one compound selected from the group consisting of nitrogen-containing compounds, sulfur-containing compounds, and carboxylic acids.

6. A composite material of claim 5 wherein said nitrogen-containing compound is a substituted triazole.

7. A composite material of claim 5 wherein said sulfur-containing compound is thiocyanuric acid.

8. A composite material of claim 5 wherein said carboxylic acid is oleic acid.

9. A composite material of claim 5 wherein said organic compound is triazinethiol.

10. A laminate obtained by laminating the composite material of claim 1 onto the surface of a substrate with the conductive fine particles facing said substrate.

11. A laminate of claim 10 wherein said conductive fine particles are of at least one member of the group consisting of metal, conductive metal oxides, and conductive organic compounds.

* * * * *